US006917029B2

(12) United States Patent
    Dierickx

(10) Patent No.: US 6,917,029 B2
(45) Date of Patent: Jul. 12, 2005

(54) FOUR-COMPONENT PIXEL STRUCTURE LEADING TO IMPROVED IMAGE QUALITY

(75) Inventor: Bart Dierickx, Mortsel (BE)

(73) Assignee: Fillfactory, Mechelen (BE)

( * ) Notice: Subject to any disclaimer, the term of this patent is extended or adjusted under 35 U.S.C. 154(b) by 17 days.

(21) Appl. No.: 10/187,479

(22) Filed: Jun. 28, 2002

(65) Prior Publication Data

US 2003/0020001 A1 Jan. 30, 2003

Related U.S. Application Data

(63) Continuation of application No. 09/157,655, filed on Sep. 21, 1998, now abandoned, which is a continuation-in-part of application No. 09/021,011, filed on Feb. 9, 1998, now Pat. No. 6,011,251.
(60) Provisional application No. 60/037,531, filed on Feb. 10, 1997.

(30) Foreign Application Priority Data

Sep. 22, 1997 (EP) .............................. 97870143
Oct. 24, 1997 (EP) .............................. 97870170

(51) Int. Cl.$^7$ ............................................. H01L 27/00
(52) U.S. Cl. ..................................... 250/208.1; 348/302
(58) Field of Search ........................ 250/208.1, 214 R, 250/214.1; 348/297, 302

(56) References Cited

U.S. PATENT DOCUMENTS

| | | | | |
|---|---|---|---|---|
| 3,770,968 A | * | 11/1973 | Hession et al. ......... | 250/214 R |
| 4,473,836 A | | 9/1984 | Chamberlain ............... | 257/290 |
| 4,565,756 A | | 1/1986 | Needs ............................. | 430/7 |
| 4,580,103 A | | 4/1986 | Tompsett ....................... | 330/9 |
| 4,647,975 A | | 3/1987 | Alston et al. ............ | 348/222.1 |
| 4,703,169 A | | 10/1987 | Arita ....................... | 250/214 R |
| 5,146,074 A | | 9/1992 | Kawahara et al. ........ | 250/208.1 |
| 5,153,420 A | | 10/1992 | Hack et al. ............... | 250/208.1 |
| 5,164,832 A | | 11/1992 | Halvis et al. ................ | 348/250 |
| 5,258,845 A | | 11/1993 | Kyuma et al. .............. | 348/299 |
| 5,296,696 A | | 3/1994 | Uno ......................... | 250/208.1 |

(Continued)

FOREIGN PATENT DOCUMENTS

| | | |
|---|---|---|
| EP | 548 987 | 6/1993 |
| EP | 657 863 | 6/1995 |
| EP | 739 039 | 10/1996 |
| GB | 2324651 | 10/1998 |
| WO | 93/19489 | 9/1993 |

OTHER PUBLICATIONS

Aoki et al., "A Collinear 3–Chip Image Sensor", *IEEE International Solid–State Circuits Conference*, 1985, pp. 102–103.

(Continued)

*Primary Examiner*—Thanh X. Luu
(74) *Attorney, Agent, or Firm*—Knobbe, Martens, Olson & Bear, LLP

(57) ABSTRACT

Pixel structures and a read-out method of pixels are disclosed. The pixel structures and the read-out method improve the image quality of imaging devices or imaging sensors based on such pixels. A pixel comprises in a parallel circuit configuration a radiation sensitive element and an adjustable current source, said current source being adapted for delivering a high current. A 4-transistor pixel structure is also disclosed. A method of obtaining a calibrated read-out signal of a pixel having at least a photosensitive element and a current source comprise a number of steps. A photocurrent generated on the pixel added to a current generated by a current source in parallel with the photosensitive element is read to obtain a first signal. The pixel is also read with the current source off to obtain a second signal. The first signal is subtracted from the second signal, and the resulting signal is amplified to obtain the read-out signal.

3 Claims, 4 Drawing Sheets

U.S. PATENT DOCUMENTS

| | | | |
|---|---|---|---|
| 5,321,528 A | 6/1994 | Nakamura | 358/482 |
| 5,329,112 A | 7/1994 | Mihara | 250/208.1 |
| 5,335,008 A | 8/1994 | Hamasaki | 348/301 |
| 5,608,204 A | 3/1997 | Hofflinger et al. | 250/208.1 |
| 5,614,744 A | 3/1997 | Merrill | 257/291 |
| 5,841,126 A | 11/1998 | Fossum | 250/208.1 |
| 5,861,621 A | 1/1999 | Takebe et al. | 250/214 R |
| 5,872,596 A | 2/1999 | Yanai | 348/297 |
| 5,933,190 A | 8/1999 | Dierickx | 348/302 |
| 5,953,060 A | 9/1999 | Dierickx | 348/241 |
| 6,133,563 A * | 10/2000 | Clark et al. | 250/208.1 |
| 6,316,760 B1 | 11/2001 | Koyama | 250/208.1 |
| 6,570,618 B1 | 5/2003 | Hashi | 348/314 |

OTHER PUBLICATIONS

Horii et al., "A 490×404 Element Imager for a Single–Chip Color Camera", *IEEE International Solid–State Circuits Conference*, 1985, pp. 96–97.

Nagakawa et al., "A 580×500–Element CCD Imager with a Shallow Flat P Well", *IEEE International Solid–State Circuits Conference*, 1985, pp. 98–99.

Mahowald, M.A., "Silicon Retina with Adaptive Photoreceptors", *SPIE*, vol. 1473, 1991, pp. 52–58.

Mann, J. "Implementing Early Visual Processing In Analog VLSI: Light Adaptation", *SPIE*, vol. 1473, 1991, pp. 128–136.

Ono et al., "Analysis of Smear Noise In Interline–CCD Image Sensor with Gate–Free Isolation Structure", Abstract of the 1991 Int'l Conference on Solid State Devices and Materials, Yokohama, 1991, pp. 68–70.

Yadid–Pecht et al., "A Random Access Photodiode Array for Intelligent Image Capture", *IEEE Transactions on Electron Devices*, vol. 38, No. 8 Aug. 1991.

Ricquier et al., "Pixel Structure with Logarithmic Response for Intelligent and Flexible Imager Architectures", *Microelectronic Engineering*, 19 (1992), pp. 631–634.

Sevenhans, et al., "A 400mm Long Linear X–Ray Sensitive Image Sensor", *IEEE International Solid–State Circuits Conference*, 1987, pp. 108–109.

Anderson, S. et al., "A Single Chip Sensor & Image Processor or Fingerprint Verification", *IEEE 1991 Custom Integrated Circuits Conference*, May 12–15, 1991, pp. 12.1.1–12.1.4.

Dierickx, Bart, "XYW Detector: A Smart Two–Dimensional Particle Sensor", *Nuclear Instruments and Mthods in Physics Research A275*, North–Holland Physics Publisihing Division, 1989, pp. 542–544.

Klein, P., "Design and Performance of Semiconductor Detectors with Integrated Amplification and Charge Storage Capability", *Nuclear Instruments and Methods in Physics Research A305*, 1991, pp. 517–526.

Aw, Chye Huat, et al., "A 128×128–Pixel Standard–CMOS Image Sensor with Electronic Shutter", *IEEE Journal of Solid State Circuits*, vol. 31, No. 12, Dec. 1996, pp. 1922–1930.

Martin, W.J. et al., "Dynamic Offset Null", *IBM Technical Disclosure Bulletin*, No. 23, No. 9, Feb. 1981, pp. 4195–4196.

* cited by examiner

FOUR-COMPONENT PIXEL STRUCTURE LEADING TO IMPROVED IMAGE QUALITY

RELATED APPLICATIONS

This application is a continuation of U.S. application Ser. No. 09/157,655, filed Sep. 21, 1998 now abandoned, which is a continuation-in-part of U.S. application Ser. No. 09/021,011, filed Feb. 9, 1998 now U.S. Pat. No. 6,011,251, which claims the benefit of U.S. Provisional Application No. 60/037,531 filed on Feb. 10, 1997; European Patent Application 97870143.1 filed Sep. 22, 1997; and European Patent Application 97870170.4 filed Oct. 24, 1997, all of which are hereby incorporated by reference.

BACKGROUND OF THE INVENTION

1. Field of the Invention

The present invention relates to solid state imaging devices being manufactured in a CMOS- or MOS-technology. More particularly, a novel pixel structure leading to an improved image quality for the imaging devices is disclosed.

2. Description of the Related Art

Solid state image sensors are well known. Virtually all solid-state imaging sensors have as a key element a photosensitive element being a photoreceptor, a photo-diode, a photo-transistor, a CCD gate, or alike. Typically, the signal of such a photosensitive element is a current which is proportional to the amount of electromagnetic radiation (light) striking the photosensitive element.

A structure with a photosensitive element included in a circuit having accompanying electronics is called a pixel. Such pixel can be arranged in an array of pixels so as to build focal plane arrays.

Commonly such solid state image sensors are implemented in a CCD-technology or in a CMOS- or MOS-technology. Solid state image sensors find widespread use in devices such as camera systems. In this embodiment a matrix of pixels comprising light sensitive elements constitutes an image sensor, which is mounted in the camera system. The signal of the matrix is measured and multiplexed to a so-called video signal.

Of the image sensors implemented in a CMOS- or MOS-technology, CMOS or MOS image sensors with passive pixels and CMOS or MOS image sensors with active pixels are distinguished. An active pixel is configured with means integrated in the pixel to amplify the charge that is collected on the light sensitive element. Passive pixels do not have such means and require a charge sensitive amplifier that is not integrated in the pixel. For this reason, active pixel image sensors are potentially less sensitive to noise fluctuations than passive pixels. Due to the additional electronics in the active pixel, an active pixel image sensor may be equipped to execute more sophisticated functions, which can be advantageous for the performance of the camera system. The functions can include filtering, operation at higher speed or operation in more extreme illuminations conditions.

Examples of such imaging sensors are disclosed in EP-A-0739039, in EP-A-0632930 and in U.S. Pat. No. 5,608,204. The imaging devices based on the pixel structures as disclosed in these patent applications, however, are still subject to deficiencies in the image quality of the devices.

A first problem in these CMOS based imaging devices appears because material imperfections and technology variations have as effect that there is a nonuniformity in the response of the pixels in the array. This effect is caused by a nonuniformity or fixed pattern noise (FPN) or by a photoresponse nonuniformity (PRNU). Correction of the nonuniformity needs some type of calibration, e.g., by multiplying or adding/subtracting the pixel's signals with a correction amount that is pixel-dependent.

An example of such photoresponse nonuniformity correction method is disclosed in EP-A-0354106. The method shown in EP-A-0354106 is subtracting a current delivered by a current source from the signal acquired in the photosensitive element and only AC-currents are used in the further signal processing circuits.

A second problem in these CMOS based imaging devices appears because the pixel structures as disclosed in EP-A-0739039, EP-A-0632930 and U.S. Pat. No. 5,608,204 are sensitive to cross-talk on the photosensitive element of the pixels. This cross-talk arises from electronic components, for instance switches, in the amplifying circuits or amplifying parts of the pixels or being connected to the pixels. The pulses generated in such switches of the amplifying circuits or amplifying parts of the pixels can be of such magnitude that due to cross-talk of these pulses on the photosensitive elements of the pixels the image quality of the imaging devices based on this pixel can be significantly degraded. Specifically the requirement for a direct connection of amplifying transistor and photosensitive element in the pixel in EP-A-0632930 gives rise this problem.

Moreover the requirement for the short-circuiting of the gate and one of the electrodes (the drain in a p-MOS configuration) of the first transistor in EP-A-0632930, and the corresponding connection of the gate and the drain electrode to one fixed potential in order to achieve a logarithmic image conversion characteristic takes away design freedom in making such pixels and sensors. Specifically these latter requirements impede achieving other improved characteristics of the imaging devices than the logarithmic conversion characteristic of the imaging devices based on the pixel in EP-A-0632930.

AIMS OF THE INVENTION

The present invention aims to achieve pixel structures and a read-out method of pixels which are able to improve the image quality of imaging devices based on such pixels.

SUMMARY OF THE INVENTION

In a first aspect, the present invention is related to a pixel comprising in a parallel circuit configuration, a radiation sensitive element and an adjustable current source. In the pixel, the current source is adapted for delivering a high current. A high current is a current that is higher than or as high as the current being generated by radiation, preferably light, impinging on the radiation sensitive element for standard imaging applications. Thus, the current source is able to be on in a condition very similar to the condition of an illumination of the pixel with a high light intensity thereby perform a calibration for instance of the FPN or PRNU of the pixel. With the term "in an illumination condition of the pixel" it is meant that a photocurrent is generated on the radiation sensitive element.

In a second aspect, the present invention is also related to a method of obtaining a calibrated read-out signal of a pixel having at least a radiation sensitive element, the method comprising the steps of reading-out a photocurrent generated on the pixel while adding a current generated by a current source in parallel with the photosensitive element to the photocurrent to thereby obtain a first signal, reading the pixel with the current source off to thereby obtain a second signal, and subtracting the first signal from the second signal, the resulting signal being amplified to obtain a read-out signal.

A method is suggested of calibrating a photosensitive element such as a photoreceptor or a photodiode in a pixel having a structure which comprises at least a photosensitive element, a first transistor in series with the photosensitive element and means comprising at least a second transistor coupled to the photosensitive element and the first transistor for reading out the signal acquired in the photosensitive element and converted to a voltage drop across the first transistor.

In this method, a current source is connected in parallel, possibly along with a switch in series with the current source, with the photosensitive element. The current source is active in a condition very similar to the condition of an illumination of the pixel with a high light intensity thereby performing a calibration of pixel non-uniformity, for instance of the FPN or PRNU of the pixel.

In a third aspect, the present invention is related to a pixel for imaging applications that is fabricated in a MOS technology. The pixel comprises a photosensitive element and a first transistor having a gate and a first and a second electrode and being in series with the photosensitive element. The first transistor and the photosensitive element form a first connection. The pixel further comprises a second transistor having a gate. The second transistor is coupled to the first connection, thereby forming a second connection. The second transistor is part of an amplifying circuit. The pixel further comprises a third transistor having a gate and two electrodes. The third transistor is in the second connection between the first connection and the second transistor. The electrodes referred to above are the drain and source contacts of the transistors. The gate of the first transistor can be at a first voltage and the first electrode (source or drain) of the first transistor can be at a second voltage.

In a preferred embodiment of the invention, the second electrode (drain or source) of the first transistor is connected to the photosensitive element, and the gate of the second transistor is connected to one of the electrodes of the third transistor. According to this embodiment of the invention, the gate of the third transistor can be at the first voltage and the other electrode of the electrodes of the third transistor is connected to the first connection. The first voltage and the second voltage can be fixed voltages or predetermined voltages or variable voltages. One of the voltages can be the supply voltage of the imaging device of which the pixel according to this aspect of the invention can form part.

Yet in another embodiment of this aspect of the invention, the pixel can further comprise an adjustable current source adapted to deliver a high current. The current source can be in a parallel configuration to the pixel.

BRIEF DESCRIPTION OF THE DRAWINGS

FIG. 3b represents a graph of the pixel current versus time the when performing the method of calibration of the photosensitive element according to a specific embodiment of the present invention and using the pixel structure of FIG. 3a.

DETAILED DESCRIPTION OF THE PREFERRED EMBODIMENTS

Figure 1A:
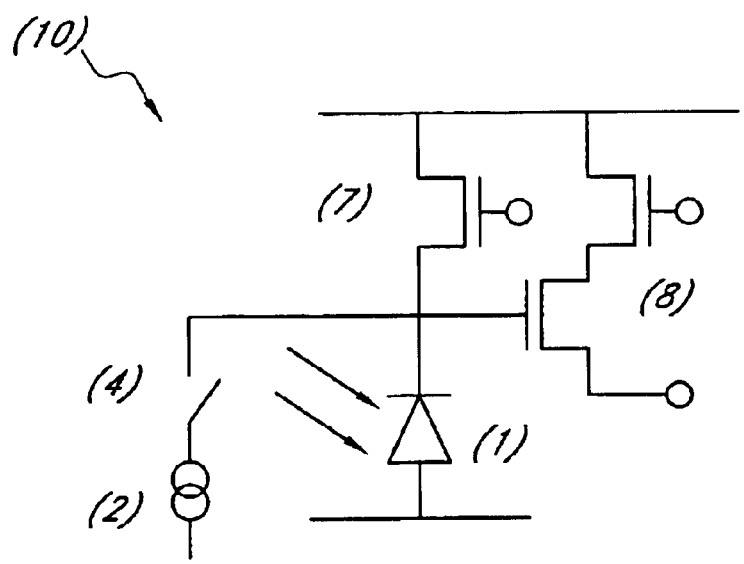
FIG. 1a represents an embodiment of a pixel according to a first aspect of the present invention which permits a calibration of the photosensitive element present in the pixel structure.
Figure 1B:
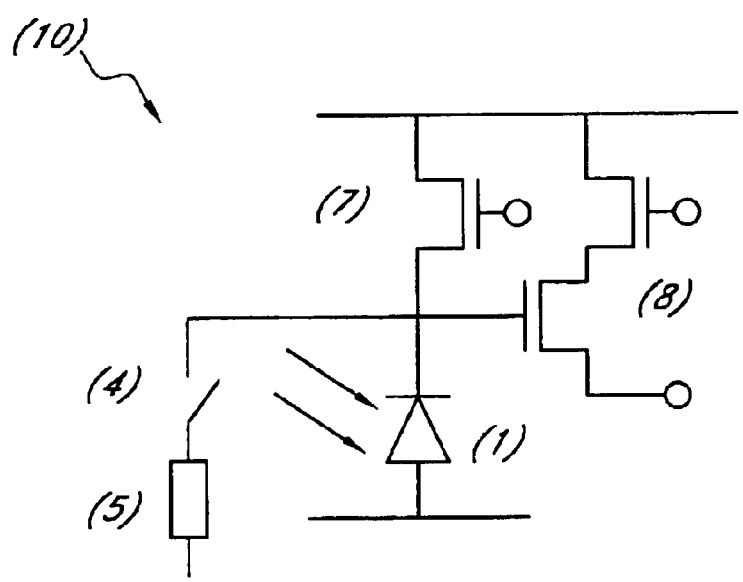
FIG. 1b represents a alternative embodiment for the pixel depicted in FIG. 1.
Figure 2:
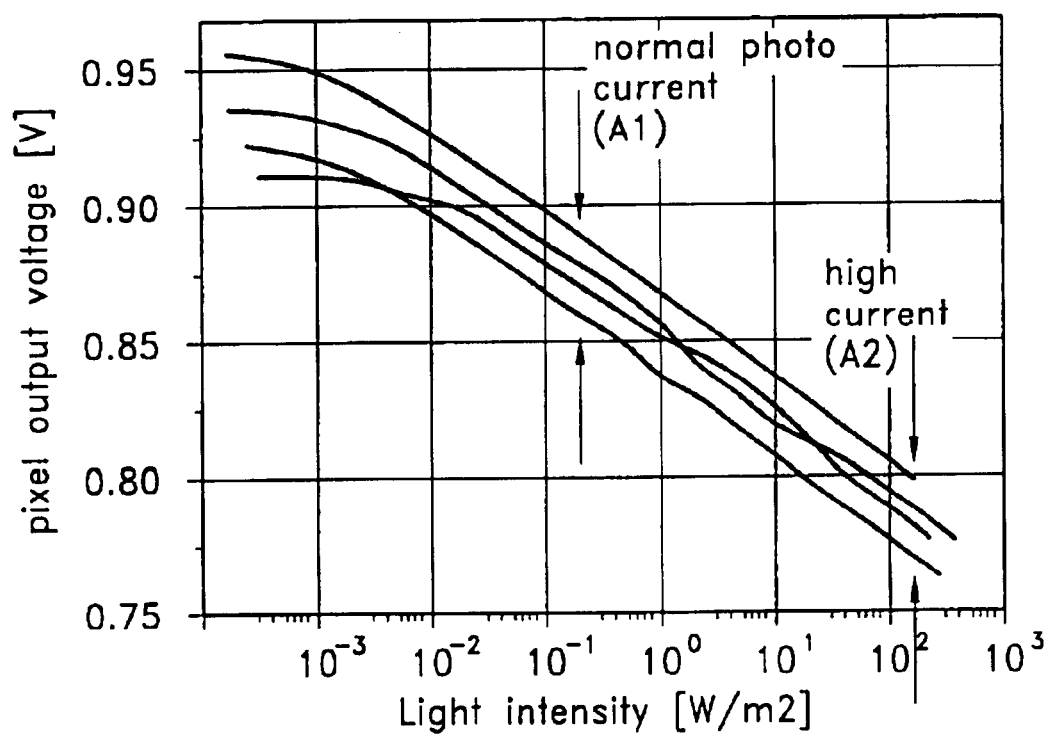
FIG. 2 represents a graph of a logarithmic pixel output voltage versus the light intensity when using the method of calibration of the photosensitive element of the pixel according to the present invention.

FIG. 1 represents a pixel (10) where the photosensitive element(s) consist of a photoreceptor (1) which yields a current proportional to the light intensity. Such a photosensitive element can also be a photodiode, a photo BJT, a photogate, or a CCD-cell. The reading of such pixels for a certain light intensity is in fact the reading of a moderate photo current or charge of the photoreceptor (1). Such pixels (10) when forming an array often exhibit a relatively large nonuniformity over the arrays. This nonuniformity is typically an offset in the output voltage, as shown in FIG. 2 for a logarithmic response pixel (10) as shown in FIG. 1. The transfer curves for each pixel do not coincide.

FIG. 2 represents the output voltage versus the input flux for a set of logarithmic pixels (10). The curves are parallel, but have an offset relative to each other. The offset can be determined by imposing a high current on the photoreceptor (1) while reading out the photocurrent of the pixels. The signal obtained for each pixel in this way must be distinguished from the "normal" reading of the pixel.

In order to calibrate the pixel (10) nonuniformities, and to be able to restore the proper value of the photocurrent, a second reading of the same pixel is done with a known or predetermined current. The photocurrent is added with a current that originates from a current source (2). This is an advantageous method as it does not involve illumination of the device.

The current source (2) can be of several kinds. For example, FIG. 1A illustrates an embodiment which provides a known current with an impedance element (5), such as a resistor, connected to a known supply voltage. Of course, it is advantageous that this current source is small in size and precise. Other possible advantageous implementations are:
a fixed current source, outside the pixel, and common for part of the imaging array. The source can be connected to several pixels in turn by switches.
a MOSFET transistor connected as current source, to be placed inside each pixel. The current source can be turned on by applying a certain DC voltage between source and gate. The current source can be turned off by turning off the gate voltage.
The current source may be composed of a "switched capacitor" circuit (see FIG. 3), where the current source is not stable, but composed of the discharge of at least one capacitor (33). In the simplest implementation, the current source in the figure is a capacitor (33) that is discharged on the photodetector node, which yields a high current during a short time.
The pixel can further comprise a further transistor (7) in series with the photosensitive element (1) and means comprising at least a second transistor (8) coupled to the photosensitive element (1) and the first transistor (7) for reading out the signal acquired in the photosensitive element and converted to a voltage drop across the first transistor (7), and further comprising a switch (4) between the current source (2) and the photosensitive element (1).

Figure 3A:
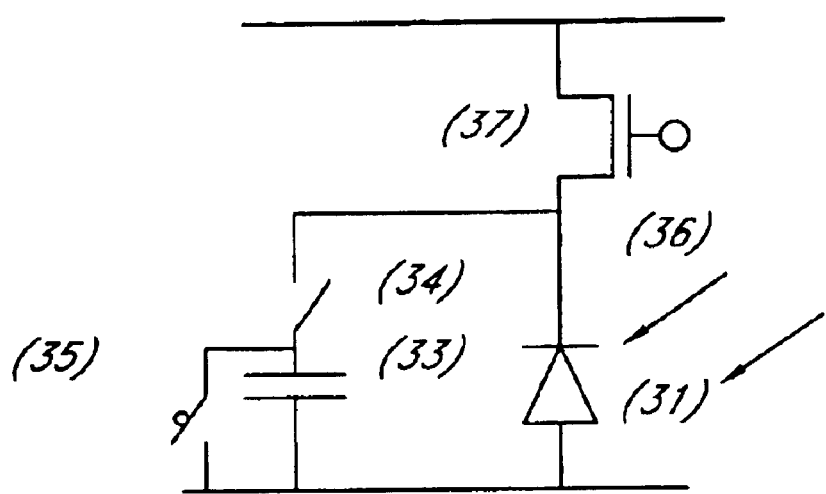
FIG. 3a represents another embodiment of the pixel according to the first aspect of the present invention where the calibration current is given by the discharge of a capacitor.
Figure 3B:
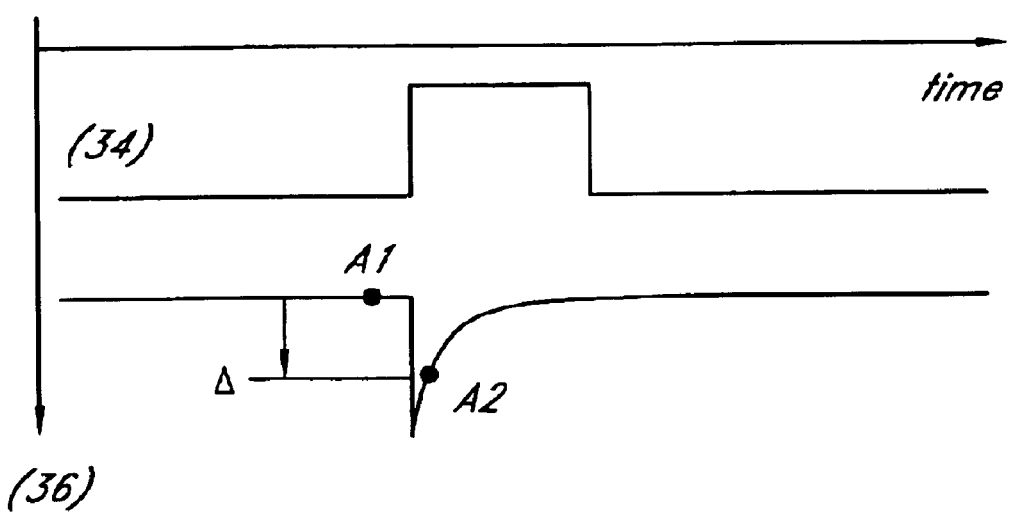

FIG. 3 is a schematic view of the implementation of the current source in a preferred embodiment as a switched capacitor network. The current is a transient of a discharge of the capacitor onto the photo diode node (36). Two samples are taken from the diode node voltage: A1, being the normal signal, and A2 taken during or after the transient of the discharge. The signal level of A2 depends only on the height of the discharge current, and not on the photo current which is smaller. The difference ($\Delta$) between A1 and A2 is then a measure of the normal sign level which is free of offset or of PRNU.

Figure 4:
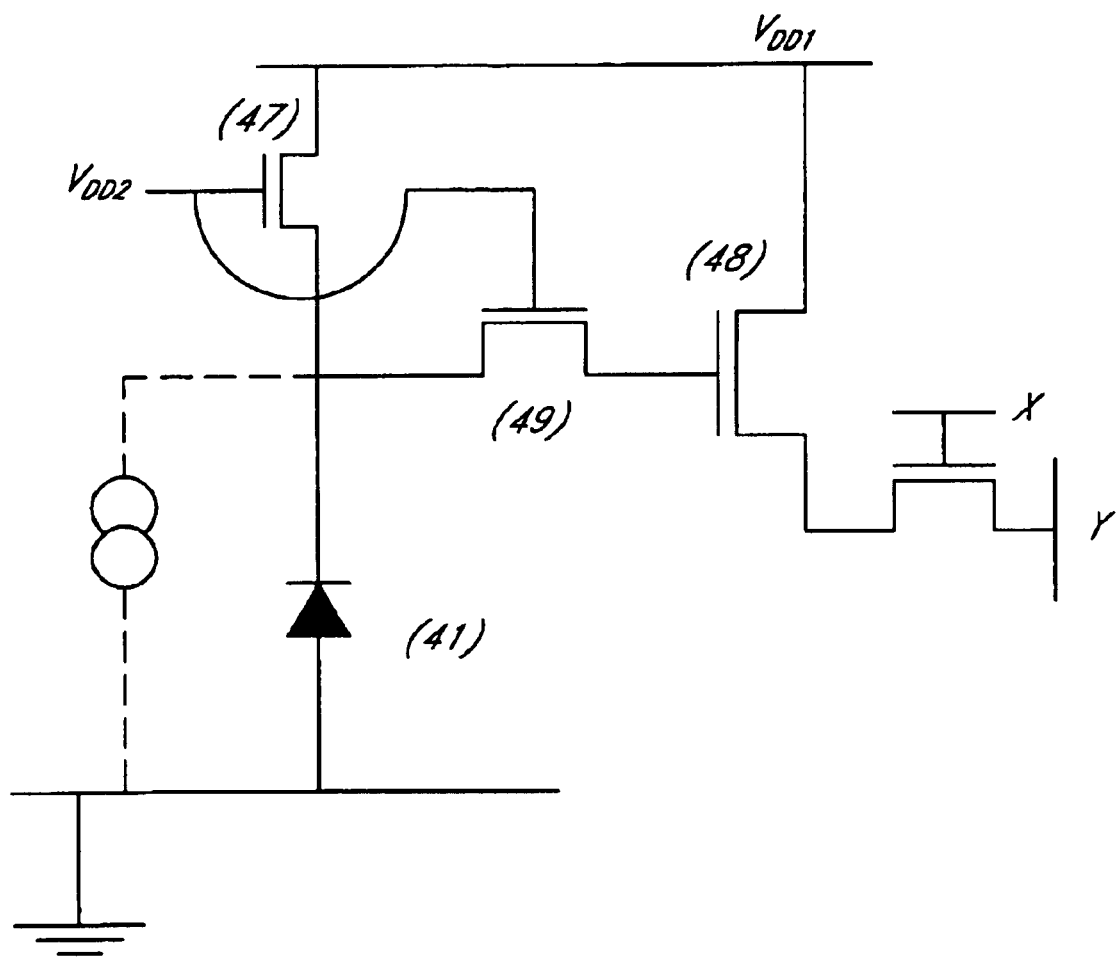
FIG. 4 illustrates a pixel structure according to a preferred embodiment of the third aspect of the invention wherein a pixel has a four-components (photosensitive element and three transistors) base structure and wherein the gates of two of the transistors are at the same voltage. The symbols X and Y refer to the row and column connections. VDD1 and VDD2 are the voltages applied to the first electrode of the first transistor and to the gates of the second and third transistors respectively.

FIG. 4 shows another aspect of the present invention involving a pixel for imaging applications that is fabricated in a MOS technology. The pixel comprises a photosensitive element (41) and a first transistor (47) having a gate and a first and a second electrode and being in series with the photosensitive element (41). The first transistor (47) and the photosensitive element (41) form a first connection or a first node. The pixel further comprises a second transistor (48) having a gate. The second transistor (48) is coupled to the first connection, thereby forming a second connection or a second node. The second transistor is part of an amplifying circuit. The amplifying circuit can be in the pixel or can be external to the pixel. The pixel further comprises a third transistor (49) having a gate and having two electrodes. The third transistor (49) is in the second connection between the first connection and the second transistor (48). The electrodes referred to above are the drain and source contacts of the transistors. The gate of the first transistor (47) can be at a first voltage VDD2 and the first electrode (source or drain) of the first transistor can be at a second voltage VDD1. In this embodiment of the invention, the second electrode (drain or source) of the first transistor (47) is connected to the photosensitive element (41), and the gate of the second transistor (48) is connected to one of the electrodes of the third transistor (49). In a preferred embodiment the gate of the third transistor (49) can be at the first voltage and the other of the electrodes of the third transistor (49) is connected to the first connection. The first voltage and the second voltage can be fixed voltages or predetermined voltages or variable voltages. One of the voltages can be the supply voltage of the imaging device of which the pixel according to this aspect of the invention can form part. Yet in another embodiment of this aspect of the invention, the pixel can further comprise an adjustable current source adapted for delivering a high current. The current source can be in a parallel configuration to the pixel.

What is claimed is:

1. A pixel for imaging applications fabricated in a MOS technology, said pixel comprising:
   a photosensitive element and a first transistor having a gate and a first and second electrode, the first electrode of the first transistor and said photosensitive element being directly connected to a same node;
   a second transistor having a gate, said second transistor being coupled to said node, thereby forming a connection, and said second transistor being part of an amplifying circuit; and
   a third transistor having a gate and having two electrodes, said third transistor being connected in said connection between said node and said second transistor, the gate of the first transistor and the gate of the third transistor being electrically coupled together to a same DC voltage;
   wherein one of said electrodes of said third transistor is connected to said gate of said second transistor and the other of said electrodes is connected to said node.

2. The pixel as recited in claim 1, wherein said gate of said first transistor is at a first voltage and said first electrode of said first transistor is at a second voltage, said second electrode of said first transistor being connected to said photosensitive element.

3. The pixel as recited in claim 1, further comprising an adjustable current source in a parallel configuration to the photosensitive element, the current source being adapted for delivering a high current.

* * * * *